US007383034B2

(12) United States Patent
Shima et al.

(10) Patent No.: US 7,383,034 B2
(45) Date of Patent: Jun. 3, 2008

(54) FREQUENCY CONVERSION CIRCUIT, MODULATION CIRCUIT, POLAR MODULATION TRANSMITTING CIRCUIT, QUADRATURE MODULATION TRANSMITTING CIRCUIT, COMMUNICATION INSTRUMENT, AND FREQUENCY CONVERSION METHOD

(75) Inventors: Takahiro Shima, Osaka (JP); Toshifumi Nakatani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 581 days.

(21) Appl. No.: 11/140,381

(22) Filed: May 27, 2005

(65) Prior Publication Data

US 2005/0266822 A1 Dec. 1, 2005

(30) Foreign Application Priority Data

May 28, 2004 (JP) ............................ 2004-159192

(51) Int. Cl.
*H04B 1/26* (2006.01)

(52) U.S. Cl. ...................................... 455/326; 455/333

(58) Field of Classification Search ..................... None
See application file for complete search history.

(56) References Cited

U.S. PATENT DOCUMENTS 6,850,753 B2 * 2/2005 Zhang et al. ............... 455/333
6,865,382 B2 * 3/2005 Behzad ....................... 455/323
6,999,746 B2 * 2/2006 Wang ......................... 455/323

FOREIGN PATENT DOCUMENTS

JP 2000-295043 10/2000

OTHER PUBLICATIONS

Hooman Darabi, et al., "Noise in RF-CMOS Mixers: A Simple Physical Model," IEEE Transactions on Solid State Circuits, vol. 35, No. 1, Jan. 2000.

* cited by examiner

*Primary Examiner*—Thanh Cong Le
(74) *Attorney, Agent, or Firm*—RatnerPrestia

(57) ABSTRACT

A frequency conversion circuit is provided capable of suppressing noise converted from about a frequency twice as large as a local signal to a reception band frequency, which performs modulation by mixing an input signal with a local signal. The frequency conversion circuit includes a first transistor whose base is electrically connected with one of a first input terminal pair inputted with the input signal; a second transistor whose base is electrically connected with the other of the first input terminal pair; third and fourth transistors whose emitters are electrically connected respectively with a collector of the first transistor; fifth and sixth transistors whose emitters are electrically connected respectively with a collector of the second transistor; and a differential noise suppression circuit provided between the collector of the first transistor and the collector of the second transistor. The differential noise suppression circuit includes at least one capacitor, which suppresses a differential noise component of a frequency twice as large as a local signal frequency without repeating charging or discharging of the capacitor with at least the local signal frequency.

18 Claims, 12 Drawing Sheets

L103
C107
C108
G103
G104
RF output
13
103
104
105
106
12
C101
LO input
11
$V_{ND1}$
$V_{ND2}$
C102
101
102
BB input
I101
G101

FREQUENCY CONVERSION CIRCUIT, MODULATION CIRCUIT, POLAR MODULATION TRANSMITTING CIRCUIT, QUADRATURE MODULATION TRANSMITTING CIRCUIT, COMMUNICATION INSTRUMENT, AND FREQUENCY CONVERSION METHOD

BACKGROUND OF THE INVENTION

1. Field of the Invention

The present invention relates to a frequency conversion circuit, a modulation circuit, a polar modulation transmitting circuit, a quadrature modulation transmitting circuit, a communication instrument, and a frequency conversion method and, in particular, to a frequency conversion circuit, a modulation circuit, a polar modulation transmitting circuit, a quadrature modulation transmitting circuit, and a frequency conversion method of direct conversion type, which are used in communication instruments for mobiles such as mobile phones and wireless LAN.

2. Related Art of the Invention

In recent years the mobile phones and the wireless LAN have become widespread at an explosive pace. Transmitting sections of the mobile phones and the wireless LAN which have become widespread in this way use the direct conversion type that frequency-converts directly into a high frequency signal, hereinafter referred to as a "RF signal" by multiplying a base band signal, hereinafter referred to as a "BB signal", by a local signal, hereinafter referred to as a "LO signal". A circuit that makes a frequency convert refers to an upconverter, and includes a frequency conversion circuit that is a circuit serving as the core for a function thereof.

FIG. 8 is a block diagram illustrating a configuration of a conventional frequency conversion circuit, as shown in "Noise in RF-CMOS Mixers: A Simple Physical Model, Hooman Darabi and A sad A. abidi. IEEE TRANSACTIONS ON SOLID STATE CIRCUITS, VOL. 35, NO. 1, JANUARY 2000" as an example. In FIG. 8, the conventional frequency conversion circuit consists of a BB signal input terminal pair 11; a transistor 101 of which base is connected with one of the BB signal input terminal pair 11; a transistor 102 of which base is connected with the other of the BB signal input terminal pair 11; transistors 103, 104 each of which emitter is connected with a collector of the transistor 101; transistors 105, 106 each of which emitter is connected with a collector of the transistor 102; a LO signal input terminal pair 12; a RF signal output terminal pair 13; an electric current source I101; and a ground G101.

One of the LO signal input terminal pair 12 is connected with the base of each of the transistors 103, 106, and the other of the LO signal input terminal pair 12 is connected with the base of each of the transistor 104, 105. One of the RF signal output terminal pair 13 is connected with collectors of the transistors 103, 105, while the other of the RF signal output terminal pair 13 is connected with collectors of the transistors 104, 106 respectively. One end of the electric current source I101 of which the other is connected with the ground G101 is connected with each of the emitters of the transistors 101, 102.

Referring to FIG. 9 illustrating a relationship between signals of respective input terminals and frequencies along with FIG. 8, the operation of the conventional frequency conversion circuit is described below.

The result obtained by multiplying a BB signal B1 inputted from the BB signal input terminal pair 11 by a LO signal L1 inputted from the LO signal input terminal pair 12 is outputted as a RF signal R1 from the RF signal output terminal pair 13. The RF signal R1 is outputted as a signal of a sum of the frequency of the LO signal L1 and the BB signal B1 and a difference therebetween. In the upconveter, the frequency of the sum of the RF signals is selected and is transmitted to a power amplifier on the downstream side.

On the same operational principle, a noise N1 around the BB signal frequency inputted from the BB signal input terminal pair 11 and a noise N2 around a frequency twice as large as the LO signal frequency are outputted to the receiving band frequency R1 of the RF signal output terminal pair 13 by multiplying the LO signal L1 inputted from the LO signal input terminal pair 12. Radiation of these noises as they are would disturb other mobile phones or a receiving circuit in the identical terminal at simultaneous sending/receiving, therefore a low pass filter (LPF) or the like is generally connected to a previous stage of the frequency conversion circuit to suppress the noise inputted into the BB signal input terminal pair 11. However, the LPF, designed so as to obtain a low cutoff frequency, can suppress the noise N1 around the BB signal frequency, while cannot suppress the noise N2 around a frequency twice as large as LO signal frequency, because of a parasitic component, therefore an additional suppressing means is required.

As an example of a frequency conversion circuit for suppressing noise around the frequency twice LO signal frequency, a "frequency conversion circuit" as shown in Japanese Patent Laid-Open No. 2000-295043 (FIG. 1, Page 5-8) is disclosed. FIG. 10 is a block diagram illustrating a configuration of a frequency conversion circuit as disclosed in Japanese Patent Laid-Open No. 2000-295043 (FIG. 1, Page 5-8).

The conventional frequency circuit shown in FIG. 10 includes capacitors C104, C105 added between the collector of the transistors 101, 102 and the ground G102. With such a configuration, both of a differential component and a common component of the noise around the frequency twice as large as LO frequency inputted from the BB input terminal pair 11 can be dropped into the ground G102 through the capacitors C104, C105.

However, in the conventional frequency conversion circuit, capacitors are connected to emitters of transistors 103, 104, 105, 106, so that switching speed at mixing is late.

FIG. 11 illustrates a time-varying characteristic 701 of voltage of node $V_{ND1}$ and a time-varying characteristic 702 of current $i_{CP}$ running through the capacitor 104 in FIG. 10. A rectangular waveform theoretical as an LO signal is illustrated by a dotted line for reference in FIG. 10. Even if the rectangular waveform theoretical as the LO signal is inputted, charging and discharging electrons are repeated in the capacitors C104, C105 each time switching is made, therefore the time-varying characteristic 701 of the voltage of node $V_{ND1}$ takes much time to rise or fall, so that instantaneous switching is impossible and, for example, the transistors 103, 104 of a pair turn on at the same time, which causes a problem that flicker noise may occur. The flicker noise, being mixed with a LO signal, is up-converted, thus causing degradation due to receiving band noise.

That is, the conventional frequency conversion circuit has a problem that flicker noise occurs because switching speed is late at mixing.

SUMMARY OF THE INVENTION

In view of the aforementioned problems, it is an object of the present invention to provide a frequency conversion circuit, a modulation circuit, a polar modulation transmitting circuit, a quadrature modulation transmitting circuit, a communication instrument, and a frequency conversion method, capable of suppressing a noise of a frequency twice as large as a local signal without generating flicker noise.

To achieve the above-described object, the first aspect of the present invention is a frequency conversion circuit performing modulation by mixing an input signal with a local signal, wherein the frequency conversion circuit comprises:

a first input terminal pair inputted with the input signal;

a second input terminal pair inputted with the local signal;

an output terminal pair outputted with an output signal;

a first transistor of which base is electrically connected with one of the first input terminal pair;

a second transistor of which base is electrically connected with the other of the first input terminal pair;

a third and a fourth transistors of which emitters are electrically connected respectively with a collector of the first transistor;

a fifth and a sixth transistors of which emitters are electrically connected respectively with a collector of the second transistor;

a differential noise suppression circuit which is provided between the collector of the first transistor and the collector of the second transistor, includes at least one capacitor, which suppresses a differential noise component of a frequency twice as large as a local signal frequency without repeating charging or discharging the capacitor with at least the local signal frequency, wherein one of the second input terminal pair is electrically connected with the base of the third and the sixth transistor, the other of the second input terminal pair is electrically connected with the base of the fourth and the fifth transistor, one of the output terminal pair is electrically connected with the collector of the third and the fifth transistor, and the other of the output terminal pair is electrically connected with the collector of the fourth and the sixth transistor.

The second aspect of the present invention is the frequency conversion circuit according to the first aspect of the present invention, wherein the frequency conversion circuit comprises a common noise suppression circuit which is electrically connected with the output terminal pair and suppresses a common noise component of a frequency twice as large as the local signal.

The third aspect of the present invention is the frequency conversion circuit according to the first aspect of the present invention, wherein the differential noise suppression circuit has a first and a second capacitors electrically connected in parallel to each other, and a resultant capacitance of the first and the second capacitors has a self resonance frequency around the frequency twice as large as the local signal.

The fourth aspect of the present invention is the frequency conversion circuit according to the third aspect of the present invention, wherein the first and the second capacitors are MIM or MOS capacitors formed on a semiconductor substrate, an upper electrode of the first capacitor is disposed so as to be electrically connected with a lower electrode of the second capacitor, and a lower electrode of the first capacitor is disposed so as to be electrically connected with an upper electrode of the second capacitor.

The fifth aspect of the present invention is the frequency conversion circuit according to the first aspect of the present invention, wherein the differential noise suppression circuit includes a capacitor and an inductor electrically connected in series to each other, and is a resonator including a resonance frequency around the frequency twice as large as the local signal.

The sixth aspect of the present invention is the frequency conversion circuit according to the first aspect of the present invention, wherein the differential noise suppression circuit includes a first and a second capacitors electrically connected in series to each other, and an impedance element, of inhibiting a signal of the local frequency, of which one is electrically connected with a junction between the first capacitor and the second capacitor and of which the other is grounded.

The seventh aspect of the present invention is the frequency conversion circuit according to the sixth aspect of the present invention, wherein the impedance element is an inductor.

The eighth aspect of the present invention is the frequency conversion circuit according to the sixth aspect of the present invention, wherein the impedance element is a resistor.

The ninth aspect of the present invention is the frequency conversion circuit according to the sixth aspect of the present invention, wherein the impedance element is a capacitor.

The tenth aspect of the present invention is the frequency conversion circuit according to the first aspect of the present invention, wherein the common noise suppression circuit is balun.

The eleventh aspect of the present invention is the frequency conversion circuit according to the second aspect of the present invention, wherein the common noise suppression circuit is such a circuit that a common signal of the frequency twice as large as the local signal is shorted.

The twelfth aspect of the present invention is the frequency conversion circuit according to the first aspect of the present invention, wherein the third and the sixth transistors are MOSFET of a triple-well structure consisting of a p-well, an n-well and a semiconductor substrate, the p-well being electrically connected with a ground terminal through a first resistor and the n-well being electrically connected with a power terminal through a second resistor.

The thirteenth aspect of the present invention is the modulation circuit comprising:

a first frequency conversion circuit;

a second frequency conversion circuit; and a 90° phase shifter connected with the first and the second frequency conversion circuits respectively, wherein the first frequency conversion circuit uses the frequency conversion circuit according to the first aspect of the present invention and the second frequency conversion circuit is the frequency conversion circuit according to the first aspect of the present invention.

The fourteenth aspect of the present invention is a quadrature modulation transmitting circuit comprising: a modulation circuit;

an oscillator of inputting a local signal into the 90° phase shifter of the modulation circuit;

a power amplifier of amplifying a signal modulated by the modulation circuit;

an isolator inputted with a signal amplified by the power amplifier; and sharing means of guiding a signal from the isolator to an antenna, wherein the modulation circuit is the modulation circuit according to the thirteenth aspect of the present invention.

The fifteenth aspect of the present invention is a polar modulation transmitting circuit comprising:

a phase modulation section;

an amplitude modulation section connected with the phase modulation section and sharing means of guiding an output signal from the amplitude modulation section to an antenna, wherein the phase modulation section uses the modulation circuit according to the thirteenth aspect of the present invention.

The sixteenth aspect of the present invention is a communication instrument comprising:

a transmitting circuit of outputting a transmitting signal and a reception circuit of inputting a reception signal, wherein the sharing means guides a reception signal received by the antenna to the reception circuit and the transmitting circuit uses the transmitting circuit according to the fourteenth aspect of the present invention.

The seventeenth aspect of the present invention is a communication instrument comprising:

a transmitting circuit of outputting a transmitting signal and a reception circuit of inputting a reception signal, wherein the sharing means guides the reception signal received by the antenna to the reception circuit and the transmitting circuit uses the transmitting circuit according to the fifteenth aspect of the present invention.

The eighteenth aspect of the present invention is a frequency conversion method performing frequency conversion for use of a frequency conversion circuit performing modulation by mixing an input signal with a local signal, wherein the frequency conversion circuit comprises:

a first input terminal pair inputted with the input signal;

a second input terminal pair inputted with the local signal;

an output terminal pair outputted with an output signal;

a first transistor of which base is electrically connected with one of the first input terminal pair;

a second transistor of which base is electrically connected with the other of the first input terminal pair;

a third and a fourth transistors of which emitters are electrically connected respectively with a collector of the first transistor;

a fifth and a sixth transistors of which emitters are electrically connected respectively with a collector of the second transistor;

wherein one of the second input terminal pair is electrically connected with the base of the third and the sixth transistor, the other of the second input terminal pair is electrically connected with the base of the fourth and the fifth transistor, one of the output terminal pair is electrically connected with the collector of the third and the fifth transistor, and the other of the output terminal pair is electrically connected with the collector of the fourth and the sixth transistor, the frequency conversion method comprising differential noise component suppressing step including at least one capacitor which, between the collector of the first transistor and the collector of the second transistor, suppresses a differential noise component of a frequency twice as large as a local signal frequency without repeating charging or discharging the capacitor with at least the local signal frequency.

The present invention can provide a frequency conversion circuit, a modulation circuit, a polar modulation transmitting circuit, a quadrature modulation transmitting circuit, a communication instrument, and a frequency conversion method, capable of suppressing a noise of a frequency twice as large as a local signal without generating flicker noise.

BRIEF DESCRIPTION OF THE DRAWINGS

FIG. 2 (*b*) is a view illustrating an example of another configuration of a differential noise suppression circuit according to a first embodiment of the present invention;

FIG. 2 (*c*) is a view illustrating an example of another configuration of a differential noise suppression circuit according to a first embodiment of the present invention;

FIG. 2 (*d*) is a view illustrating an example of another configuration of a differential noise suppression circuit according to a first embodiment of the present invention;

FIG. 3 (*b*) is a view illustrating an example of another configuration of a common noise suppression circuit according to a first embodiment of the present invention;

FIG. 3 (*c*) is a view illustrating an example of another configuration of a common noise suppression circuit according to a first embodiment of the present invention;

FIG. 3 (*d*) is a view illustrating an example of another configuration of a common noise suppression circuit according to a first embodiment of the present invention;

DESCRIPTION OF SYMBOLS

Figure 1:
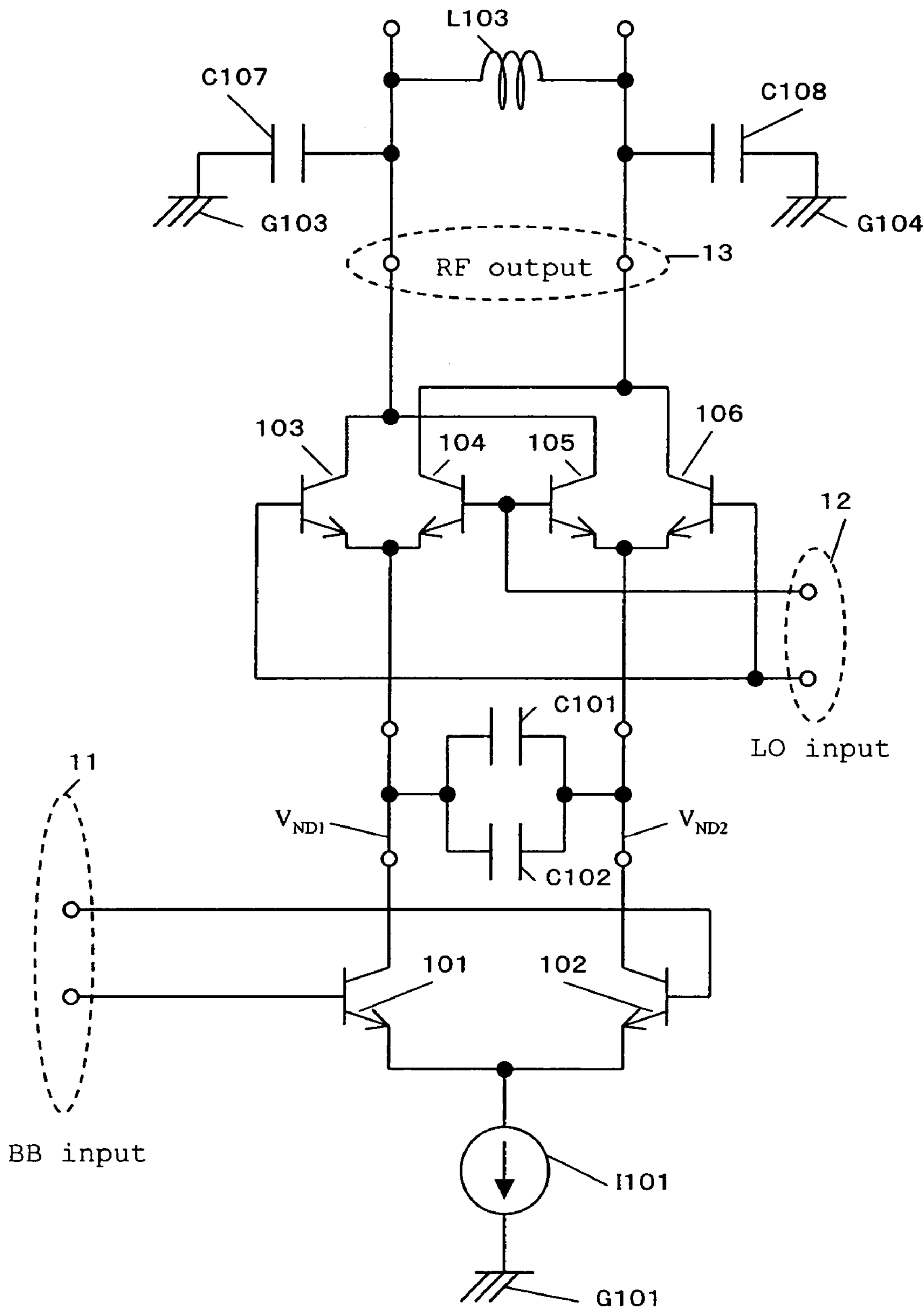
FIG. 1 is a view illustrating a configuration of a frequency conversion circuit according to the first embodiment of the present invention.
Figure 2A:
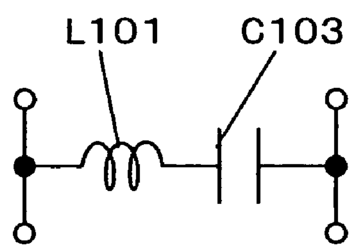
FIG. 2 (*a*) is a view illustrating an example of another configuration of a differential noise suppression circuit according to a first embodiment of the present invention.
Figure 2B:
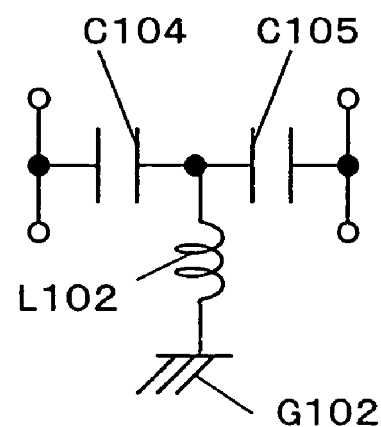
Figure 2C:
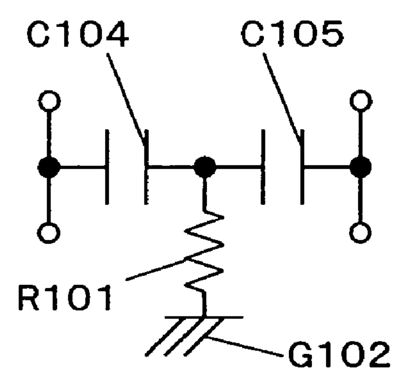
Figure 2D:
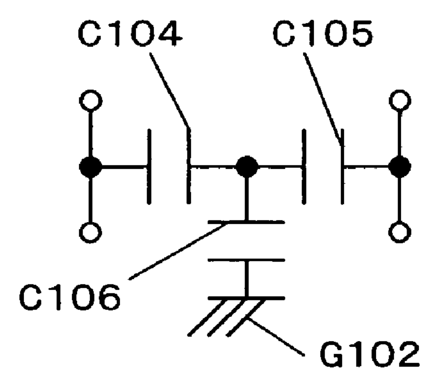
Figure 3A:
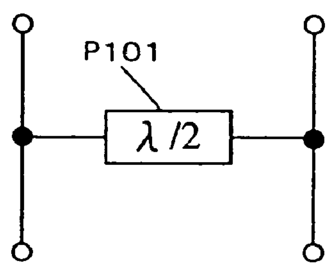
FIG. 3 (*a*) is a view illustrating an example of another configuration of a common noise suppression circuit according to a first embodiment of the present invention.
Figure 3B:
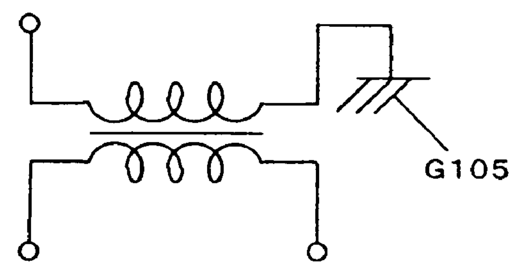
Figure 3C:
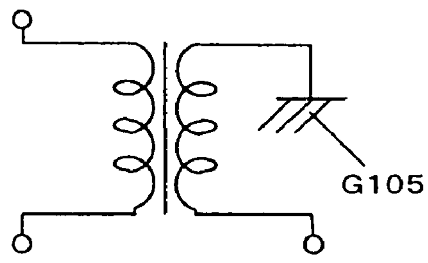
Figure 3D:
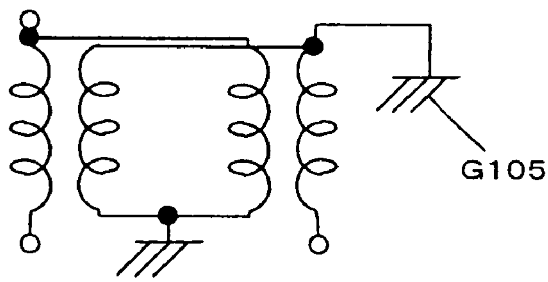

11 BB signal input terminal pair
12 LO signal input terminal pair
13 RF signal output terminal pair
31 BB signal input terminal pair of I system
32 BB signal input terminal pair of Q system
33 LO signal input terminal pair

34 RF signal output terminal pair
51 I input terminal
52 Q input terminal
101, 102, 103, 104, 105, 106 Transistor
201 Gate electrode
202 Drain electrode
203 Source electrode
204 Gate oxide film
205 p-well
206 n-well
207 Substrate
211 Gate terminal
212 Drain terminal
213 Source terminal
214 Power terminal
301, 302 Frequency conversion circuit
303 90° phase shifter
500 Modulation circuit
501, 502 Frequency conversion circuit
503 90° phase shifter
504 Oscillator
505 Power amplifier
506 Isolator
507 Sharing means
508 Antenna
511 Amplitude/phase information conversion section
512 Bias control section
701 Time-varying characteristic of voltage of node $V_{ND1}$
702 Time-varying characteristic of current $i_{CP}$
B1 BB signal
L2 LO signal
R1 RF signal
N1 Noise around BB signal frequency
N2 Noise around frequency twice as large as LO signal
R1 Reception band
T1 Transmitting band
C101, C102, C103, C104, C105, C106, C107, C108 Capacitor
G101, G102, G103, G104, G105, G201, G202 Ground
I101 Electric current source
L101, L102, L103 Inductor
P101 λ/2 phase shift circuit

PREFERRED EMBODIMENTS OF THE INVENTION

Hereinafter, with reference to the drawings, the description will be made of embodiments according to the present invention.

First Embodiment

FIG. 1 is a view illustrating a configuration of a frequency conversion circuit according to the first embodiment of the present invention.

In FIG. 1, a mixer circuit consists of: a BB signal input terminal pair 11; a transistor 101 of which base is connected with one of the BB signal input terminal pair 11; a transistor 102 of which base is connected with the other of the BB signal input terminal pair 11; transistors 103, 104 of which emitters are respectively connected with a collector of the transistor 102; transistors 105, 106 of which emitters are respectively connected with a collector of the transistor 102; a LO signal input terminal pair 12; pa RF signal output terminal pair 13, an electric current source I101; a ground G101; and capacitors C101, C102.

One of the LO signal input terminal pair 12 is connected with bases of the transistors 103, 106 respectively, while the other of the LO signal input terminal pair 12 is connected with bases of the transistors 104, 105 respectively. One of the RF signal output terminal pair 13 is connected with collectors of the transistors 103, 105, while the other of the RF signal output terminal pair 13 is connected with collectors of the transistors 104, 106 respectively. The parallel connected capacitors C101, C102 are connected between the collectors of the transistors 101, 102.

The parallel connected capacitors C101, C102 are an example of a differential noise suppression circuit, and the resultant capacitance of the capacitors C101 and C102 has a self resonant frequency around a frequency twice as large as a LO signal.

To the RF signal output terminal pair 13, capacitors C107, C108 are connected respectively between grounds G103, G104, and an inductor L103 is connected between terminals of the RF signal output terminal pair 13.

The frequency conversion circuit in FIG. 1 consists of such circuit elements as described above, which are electrically connected as described.

The capacitors C107, C108, the inductor L103, and the grounds G103, G104 are an example of a common noise suppression circuit, and the capacitors C107, C108 have a self resonant frequency respectively around the frequency twice as large as the LO signal.

The BB signal input terminal pair 11 of the first embodiment is an example of the first input terminal pair according to the present invention. The LO signal input terminal pair 12 of the first embodiment is an example of the second input terminal pair according to the present invention. The RF output terminal pair 13 of the first embodiment is an example of the output terminal pair according to the present invention. Moreover, the transistor 101 of the first embodiment is an example of the first transistor according to the present invention, the transistor 102 of the first embodiment is an example of the second transistor according to the present invention, and the transistors 103, 104 of the first embodiment are respective examples of the third and the fourth transistors according to the present invention. The transistors 105, 106 of the first embodiment are examples of the fifth and the sixth transistors according to the present invention respectively. Furthermore, the capacitor C101 of the first embodiment is an example of the first capacitor according to the present invention, and the capacitor C102 of the first embodiment is an example of the second capacitor according to the present invention.

Referring to FIG. 1, the operation of the frequency conversion circuit of the first embodiment is described below. A balance type BB signal inputted from the BB signal input terminal pair 11 is inputted into the transistors 101, 102 to be amplified. At this time, the noise around a frequency twice as large an LO signal is also amplified in the same way. Each of the capacitors C101, C102 connected between the collectors of the transistors 101, 102 has a self resonant frequency around the frequency twice as large as a LO signal, therefore impedance becomes very low around the frequency twice as large as the LO signal. The noise around the frequency twice as large the LO signal is shorted at the capacitors C101, C102, so that a differential component of the noise is compensated for. The BB signal in which the noise around the frequency twice as large the LO signal is reduced is mixed with a balance type LO signal inputted from the LO signal input terminal pair 12, RF signals of the frequencies of a sum and a difference of/between of the LO signal and the BB signal are outputted to the RF signal output terminal pair 13. In the common noise suppression circuit connected to a previous stage of the RF signal output terminal pair 13, the inductor 103 is open to a common noise component around a frequency twice as large as an LO signal and only the capacitors C107, C108 are visible, so that the common noise suppression circuit serves to drop only the common noise component onto the ground.

That is, of signals inputted from the BB signal input terminal pair 11, the differential component of the noise of the frequency twice as large as the LO signal is compensated for by the differential noise suppression circuit, and the common component of the noise of the frequency twice as large as the LO signal is dropped onto the ground by the common noise suppression circuit. Therefore, it is reduced that both of the differential component and the common component of the noise of the frequency twice as large as the LO signal of the signals inputted from the BB signal input terminal pair 11 are converted into a reception band frequency of the output terminal pair 105.

On the other hand, voltages of nodes $V_{ND1}$, $V_{ND2}$ are in a common state to a LO signal, and an impedance relative to the LO signal is not low between the nodes $V_{ND1}$, $V_{ND2}$, therefore no electric current runs through the capacitors C101, C102, so that the capacitors C101, C102 never repeat charging and discharging at a frequency of the LO signal. Therefore, neither of a switching speed between the transistors 103 and 104 nor a switching speed between the transistors 105 and 106 decreases, thus generating no flicker noise.

In a direct conversion system, a frequency twice as large as a LO signal becomes sufficiently high, so that the capacitors C101, C102 in FIG. 1 taking the frequency as a self resonant frequency become low enough to relatively facilitate conversion to IC form. This can actualize a frequency conversion circuit capable of suppressing noise in a received frequency zone without need for enlarging a wireless section.

Furthermore, in the direct conversion system, the frequency twice as large as the LO signal becomes high sufficiently, so that the capacitors C107, C108 in FIG. 1 taking the frequency as a self resonant frequency become sufficiently low, and the inductor L103 open to a common noise component around the frequency twice as large as the LO signal is low enough to make the common noise suppression circuit IC-compatible relatively easily. This can actualize a frequency conversion circuit capable of suppressing noise in a received frequency zone without need for enlarging a wireless section.

As the capacitors C101, C102, a MIM capacitor or a MOS capacitor formed on a semiconductor substrate is used. An upper electrode of the capacitor C101 is disposed so as to be connected with a lower electrode of the capacitor C102, and a lower electrode of the capacitor C101 is disposed so as to be connected with an upper electrode of the capacitor C102. With this constitution, the capacitors C101, C102 have such a configuration as to be symmetrical when viewed from the connection side to the transistor 101 and when viewed from the connection side to the transistor 102. Thus, a balance characteristics of a double balance mixer is not out of balance.

Figure 12:
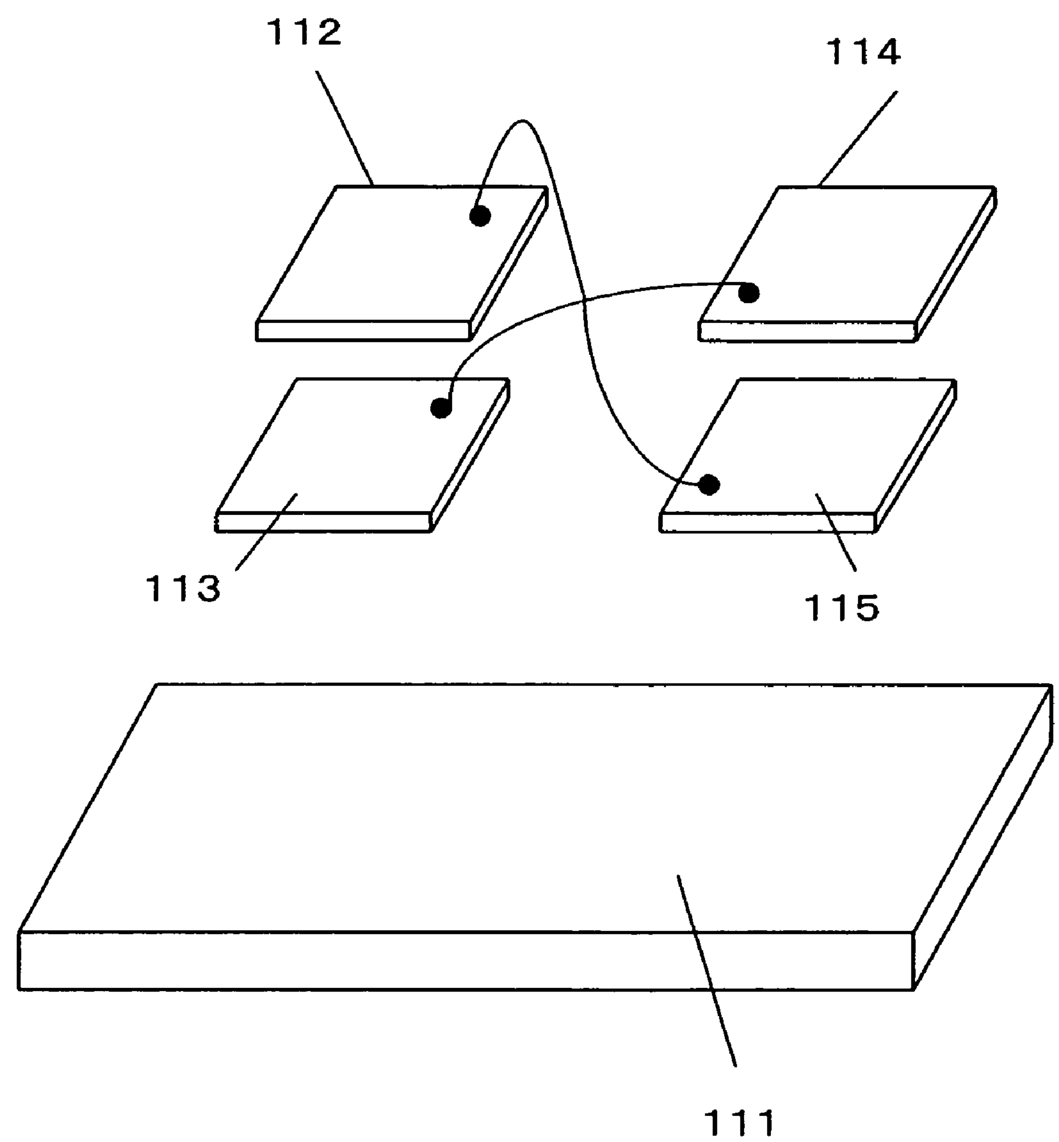
FIG. 12 is a pattern diagram illustrating a connection relationship between two capacitors.

FIG. 12 is a pattern diagram of connection of the capacitor 101 with the capacitor C102. In FIG. 12, the capacitor C101 and the capacitor C102 are formed on the semiconductor substrate 111. The capacitor C101 consists of an upper electrode 112 disposed distant from the semiconductor substrate 111 and an upper electrode 113 near the semiconductor substrate 111. The capacitor C102 consists of an upper electrode 114 disposed distant from the semiconductor substrate 111 and an lower electrode 115 near the semiconductor substrate 111. The upper electrode 112 of the capacitor C101 is electrically connected with the lower electrode 115 of the capacitor C102, and the lower electrode 113 of the capacitor C101 is electrically connected with the upper electrode 114 of the capacitor C102. As the capacitors C101, C102, the double balance mixer can be kept so as to ensure that the balance characteristic is not out of balance as described above by making a connection as illustrated in a pattern diagram of FIG. 12.

As described above, a differential noise component in a high-frequency range can be briefly compensated for by basic characteristics of lowering impedance in a high-frequency range of capacitor.

FIG. 2 (*a*) to FIG. 2 (*d*) illustrate other configurations of capacitors C101, C102 and can achieve similar effects.

FIG. 2 (*a*) illustrates a resonator having a resonance frequency around a frequency twice as large as a LO signal, which is constituted by connecting an inductor L101 with a capacitor C103 in series.

Use of a circuit configuration of a resonance as illustrated in FIG. 2 (*a*) gives a sharp passing characteristic, therefore the noise around a frequency twice as large as the LO signal is shorted in a narrow band, thus compensating for a differential noise component.

In the capacitor C103 and the inductor L101, the noise around a frequency twice as large as a LO signal is shorted in a narrow band, so that impedance for the LO signal does not decrease. Therefore, current of the frequency of the LO signal never run through the capacitor C103, so that the capacitor C103 never repeat charging and discharging at the frequency of the LO signal, thus preventing generation of flicker noise.

FIG. 2 (*b*) illustrates a configuration in which the capacitors C104, C105 are connected in series and the inductor L102 is connected between a junction of the capacitors C104 and C105 and the ground G102, and a resultant capacitor of the C104 and the C105 has a self resonance frequency around a frequency twice as large as a LO signal. L102 has a large impedance around the frequency of the LO signal.

Use of a circuit configuration as illustrated in FIG. 2 (*b*) shorts the noise around a frequency twice as large as a LO signal to suppress a differential noise component, which is cut off from the ground around the frequency of the LO signal by the inductor L102, so that no electric current runs through the ground, and the capacitors C104 and C105 never repeat charging and discharging at the frequency of the LO signal, thus further preventing generation of flicker noise.

FIG. 2 (*c*) illustrates a configuration in which the capacitors C104, C105 are connected in series and the resistor R101 is connected between a junction of the capacitors C104 and C105 and the ground G102, and a resultant capacitor of the C104 and the C105 has a self resonance frequency around a frequency twice as large as a LO signal. A resistance value of R101 is sufficiently large.

Use of a circuit configuration illustrated in FIG. 2 (*c*) shorts the noise around a frequency twice as large as a LO signal to suppress a differential noise component. Furthermore, the resistor R101 makes cutting-off from the ground in the whole band, so that no electric current runs through the ground, and the capacitors C104, C105 never repeat charging and discharging in the whole band including the frequency of the LO signal, thus preventing generation of flicker noise more positively. In addition, the resistor 101, specifically a resistor of 1 kΩ or more can prevent generation of flicker noise.

FIG. 2 (*d*) illustrates a configuration in which the capacitors C104, C105 are connected in series and the capacitor C106 is connected between a junction of the capacitors C104 and C105 and the ground G102, and a resultant capacitor of the C104 and the C105 has a self resonance frequency around a frequency twice as large as a LO signal. The C106 has a self resonance frequency sufficiently distant from around the frequency of the LO signal.

Use of a circuit configuration illustrated in FIG. 2 (*d*) shorts the noise around a frequency twice as large as a LO signal to suppress a differential noise component. Furthermore, the capacitor C106 makes cutting-off from the ground around the frequency of the LO signal, so that no electric current runs through the ground, and the capacitors C104, C105 never repeat charging and discharging, thus preventing generation of flicker noise.

As examples of other configurations of the capacitors C101, C102 in FIG. 1, FIG. 2 (*a*) to FIG. 2 (*d*) are explained above, however, other configurations except those in FIG. 2 (*a*) to FIG. 2 (*d*) may be used as the examples of other configurations of the capacitors C101, C102 in FIG. 1. To put it briefly, the capacitors C101, C102, provided in between the collector of the transistor 101 and the collector of the transistor 102, has at least one capacity and only serve as a differential noise suppression circuit for suppressing a differential noise component of a frequency twice of the local signal frequency without repeating charging or discharging the capacitor with at least the local signal frequency.

FIG. 3 (*a*) to FIG. 3 (*d*) illustrate examples of other configurations of a common noise suppression circuit with a frequency twice as large as a LO signal, which is connected with a subsequent stage of the RF signal output terminal pair 13 in FIG. 1, and produce similar effects.

FIG. 3 (*a*) is connected with a λ/2 phase-shift circuit P101, which produces a half-wave length for a frequency twice as large as a LO signal, between RF signal output terminals.

Use of the λ/2 phase-shift circuit P101 in FIG. 3 (*a*) reduces only a common noise component around a frequency twice as large as a LO signal because impedance is very low.

FIG. 3 (*b*) to FIG. 3 (*d*) illustrate examples of configurations of balun. The balun executes operation of outputting only a differential component by dropping a common component onto the ground G105, so that the common noise component around the frequency twice as large as the LO signal is suppressed.

In FIG. 1, a bipolar transistor is used as a transistor, however, needless to say, MOSFET can constitute the same circuit.

Figure 4:
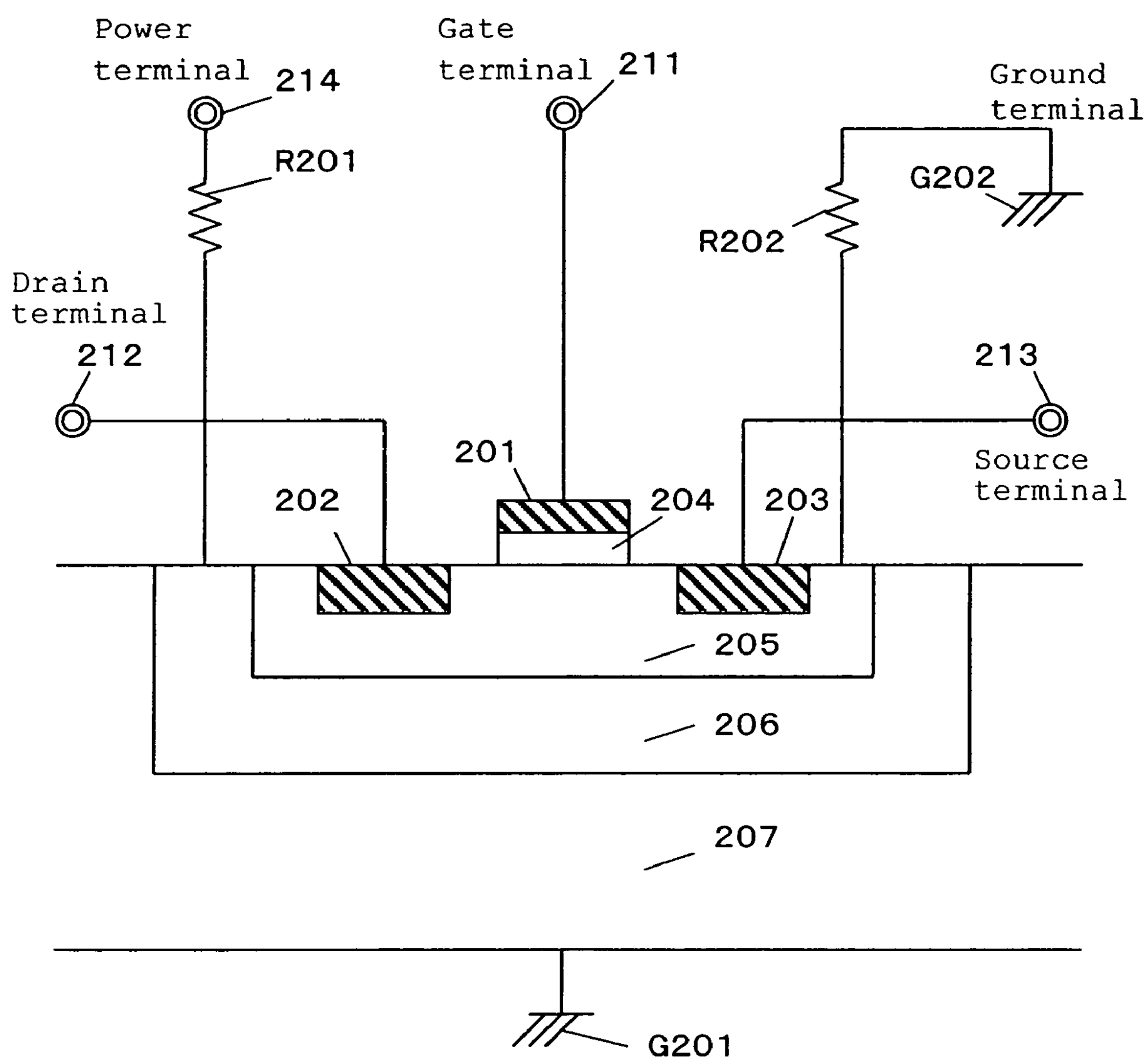
FIG. 4 is a view illustrating a configuration of MOSFET of a triple-well structure according to a first embodiment of the present invention.

Use of MOSFET of triple-well structure illustrated in FIG. 4 as the transistors 103, 104, 105, 106 can suppress generation of flicker noise.

In FIG. 4, the MOSFET of triple-well structure is formed with a n-well 206 on a semiconductor substrate 207 such as silicon. A p-well 205 is formed on the n-well 206. On the p-well 205, there are formed a drain electrode 202, a source electrode 203, and a gate oxide film 204. A gate electrode 201 is formed on the gate oxide film 204.

A gate terminal 211 is connected to the gate electrode 201, a drain terminal 212 is connected to the drain electrode 202, and a source terminal 213 is connected to a source electrode 203. Between n-well 206 and a power terminal 214, a resistor 201 is connected, and between a p-well 205 and the ground G202, the resistor R202 is connected.

In the triple-well of MOSFET, part of the p-well 205 in contact with the n-well 206 and part of the substrate 207 in contact with the n-well 206 have a depletion layer respectively. As a result, an effect of a parasitic capacity in a space to the ground G201 can be reduced, thus suppressing generation of flicker noise.

As described above, the frequency conversion circuit of the first embodiment suppresses a differential noise component around a frequency twice as large as a LO signal of a BB signal inputted into a mixer circuit without generating flicker noise, thereby suppressing noise down-converted to a reception band frequency of an output.

Hence, the frequency conversion circuit of the first embodiment can realize a transmitting circuit capable of suppressing reception frequency band noise.

In this respect, in the above description of the frequency conversion circuit of the first embodiment, the description has been made of a case where the frequency conversion circuit includes a common noise suppression circuit constituted of the capacitors C107, C108, the inductor L103, and grounds G103, G104, but not limited to this, it may eliminate use of the common noise suppression circuit.

Second Embodiment

Figure 5:
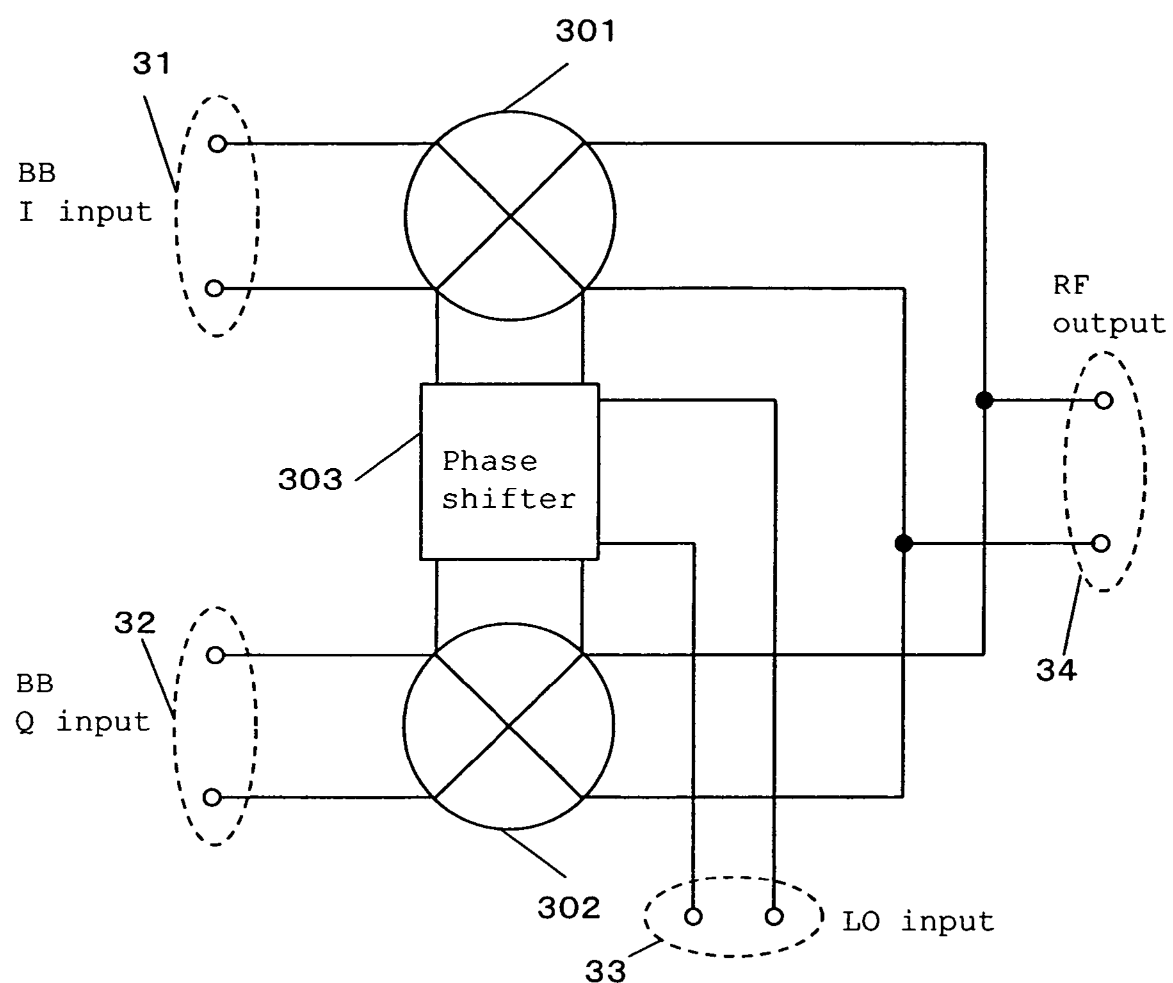
FIG. 5 is a view illustrating a configuration of a modulation circuit according to a second embodiment of the present invention.

FIG. 5 illustrates a circuit configuration of a modulation circuit according to the second embodiment of the present invention. The modulation circuit of the second embodiment consists of a frequency conversion circuit 301 of an I system, a frequency conversion circuit 302 of a Q system, a 90° phase shifter 303, a BB signal input terminal pair 31 of the I system, a BB signal input terminal pair 32 of the Q system, and a LO signal input terminal pair 33. Either of the frequency conversion circuit 301 of the I system and the frequency conversion circuit 302 of the Q system is a frequency conversion circuit having the same configuration as the first embodiment.

The LO signal input terminal pair 33 is connected via the 90° phase shifter 303 to the frequency conversion circuit 301 of the I system and the frequency conversion circuit 302 of the Q system. The BB signal input terminal pair 31 of the I system is connected via the frequency conversion circuit 301 of the I system to the output terminal pair 34. Similarly, the BB signal input terminal pair 32 of the Q system is connected via the frequency conversion circuit 302 of the Q system to the RF signal output terminal pair 34.

Referring to FIG. 5, the operation of the modulation circuit of the second embodiment is described below.

A LO signal of a balance inputted from the LO signal input terminal pair 33 is converted so that a phase difference of 90° may be produced between a signal outputted to the frequency conversion circuit 301 of the I system and a signal outputted to the frequency conversion circuit 302 of the Q system by the 90° phase shifter 303. Hence, a signal outputted to a RF signal output terminal pair 34 by connecting a signal outputted as a result of a BB signal inputted from the BB signal input terminal pair 31 of the I system being mixed by the frequency conversion circuit 301 of the I system with a signal outputted as a result of a BB signal inputted from the BB signal input terminal pair 32 of the Q system being mixed by the frequency conversion circuit 302 of the Q system, is converted to a signal in which I and Q signals are orthogonal to each other. Use of the frequency conversion circuit 301 of the I system having the same configuration as the first embodiment and the frequency conversion circuit 302 of the Q system having the same configuration as the first embodiment can suppress a level of reception frequency band noise in the RF signal output terminal pair 34.

In the modulation circuit of the second embodiment, use of the frequency conversion circuit 301 of the I system having the same configuration as the first embodiment and the frequency conversion circuit 302 of the Q system having the same configuration as the first embodiment in this way can realize a modulation circuit capable of suppressing reception frequency band noise.

Furthermore, a frequency divider may be used as the phase shifter 303 of the second embodiment.

Third Embodiment

Figure 6:
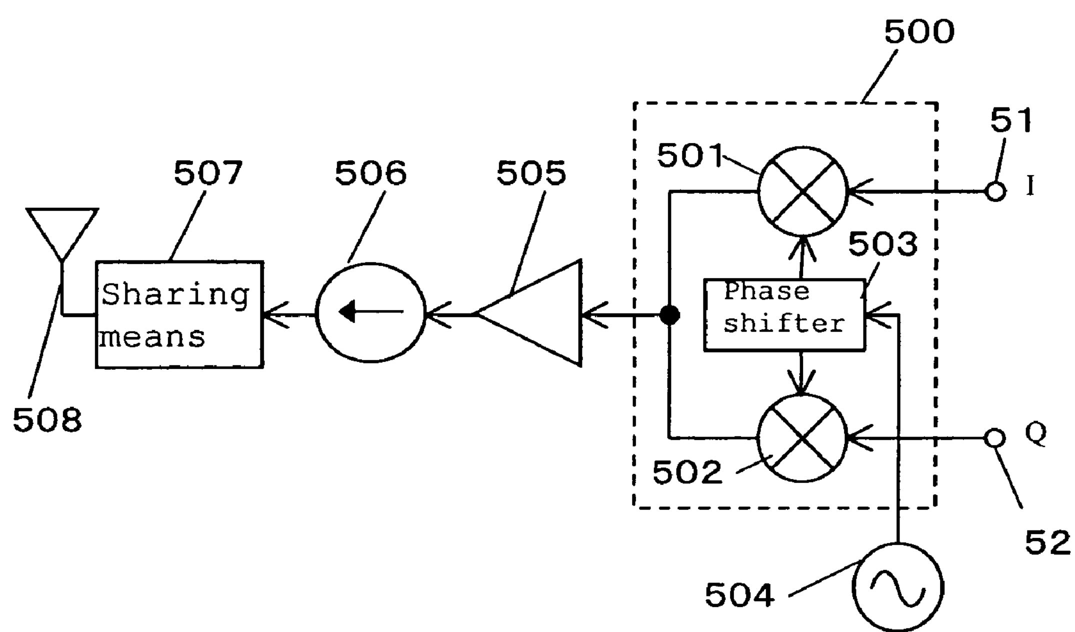
FIG. 6 is a view illustrating a configuration of a transmitting circuit according to a third embodiment of the present invention.

FIG. 6 is a view illustrating a configuration of a transmitting circuit of the third embodiment according to the present invention.

The transmitting circuit of the third embodiment consists of a modulation circuit 500 having the same constitution as the second embodiment 2 in FIG. 5, an oscillator 504, a power amplifier 505, an isolator 506, a sharing means 507, an antenna 508, an I input terminal 51, and a Q input terminal 52.

Referring to FIG. 6, the operation of the transmitting circuit of the third embodiment is described below.

Base band I and Q signals are inputted into each of the I input terminal 51 and the Q input terminal 52. The inputted signals are mixed for modulation with a LO signal inputted through the oscillator 504 and the 90° phase shifter 503 by frequency conversion circuits 501, 502. An output the modulated modulation circuit 500 is amplified by the power amplifier 505 and radiated from the antenna 508 through the isolator 506 and the sharing means 507.

With such a configuration as described above, the transmitting circuit of the third embodiment can actualize a transmitting circuit capable of achieving a low level of reception band noise outputted from the modulation circuit 500.

The third embodiment can also actualize a novel communication instrument capable of transmitting a signal of reduced reception zone noise by providing a communication instrument such as a mobile phone, PDA or a communication card with a transmitting circuit of the third embodiment. Namely, such a communication instrument specifically includes the transmitting circuit of the third embodiment for outputting a transmitting signal and a reception circuit for inputting a reception signal, and the sharing means 507 is a communication instrument which guides a signal received by the antenna 508 to a reception circuit. Thus the sharing means 507 includes not only a function of guiding a transmitting signal outputted from the isolator 506 to the antenna 508, but also a function of guiding a signal received by the antenna 508 to the reception circuit.

Fourth Embodiment

Figure 7:
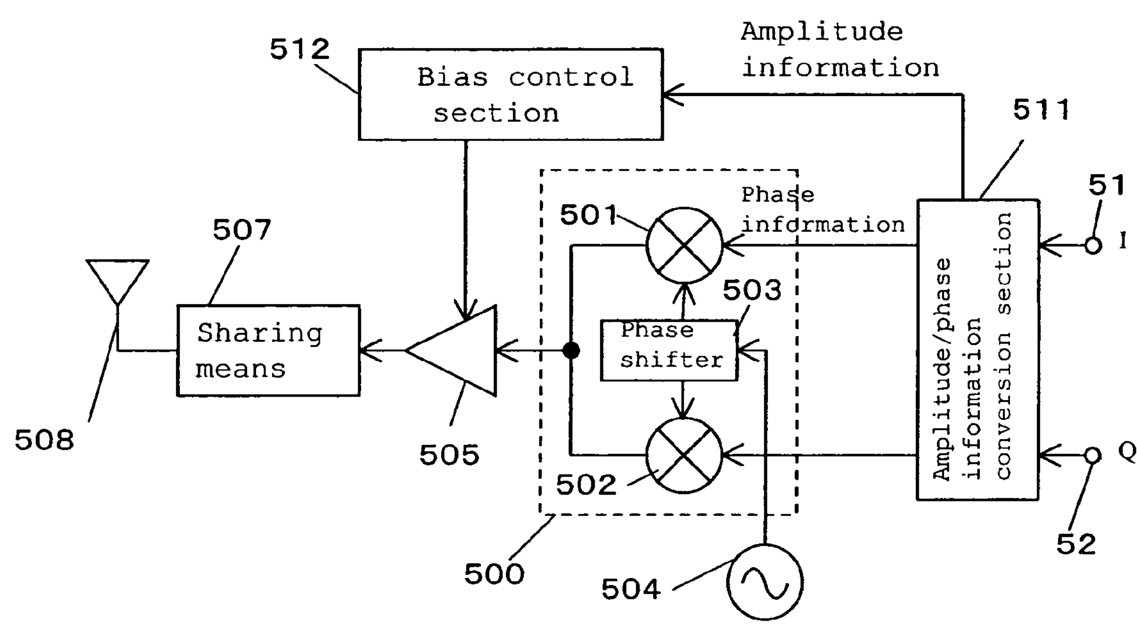
FIG. 7 is a view illustrating a configuration of a transmitting circuit according to a fourth embodiment of the present invention.
Figure 8:
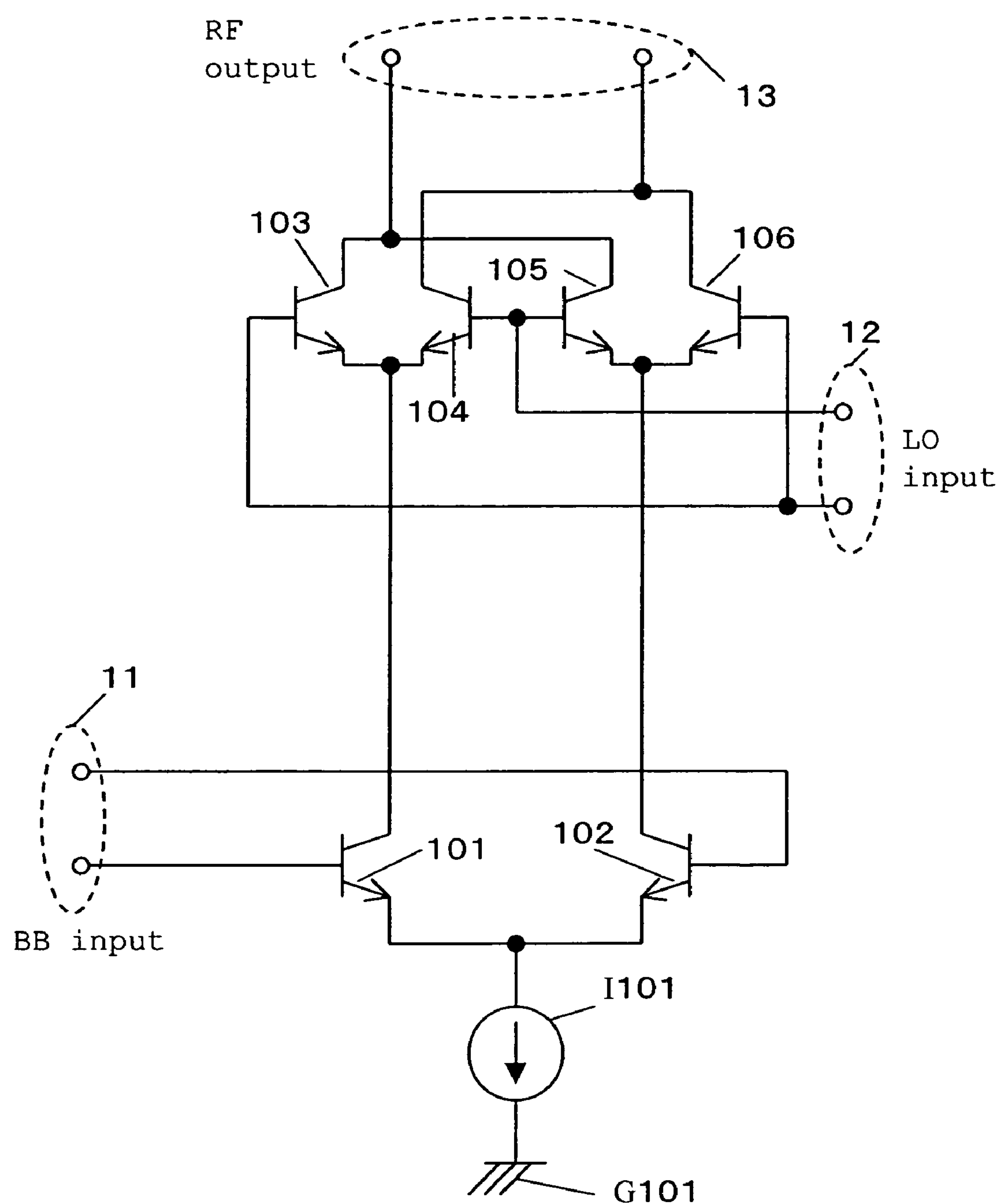
FIG. 8 is a view illustrating a conventional first frequency conversion circuit.
Figure 9:
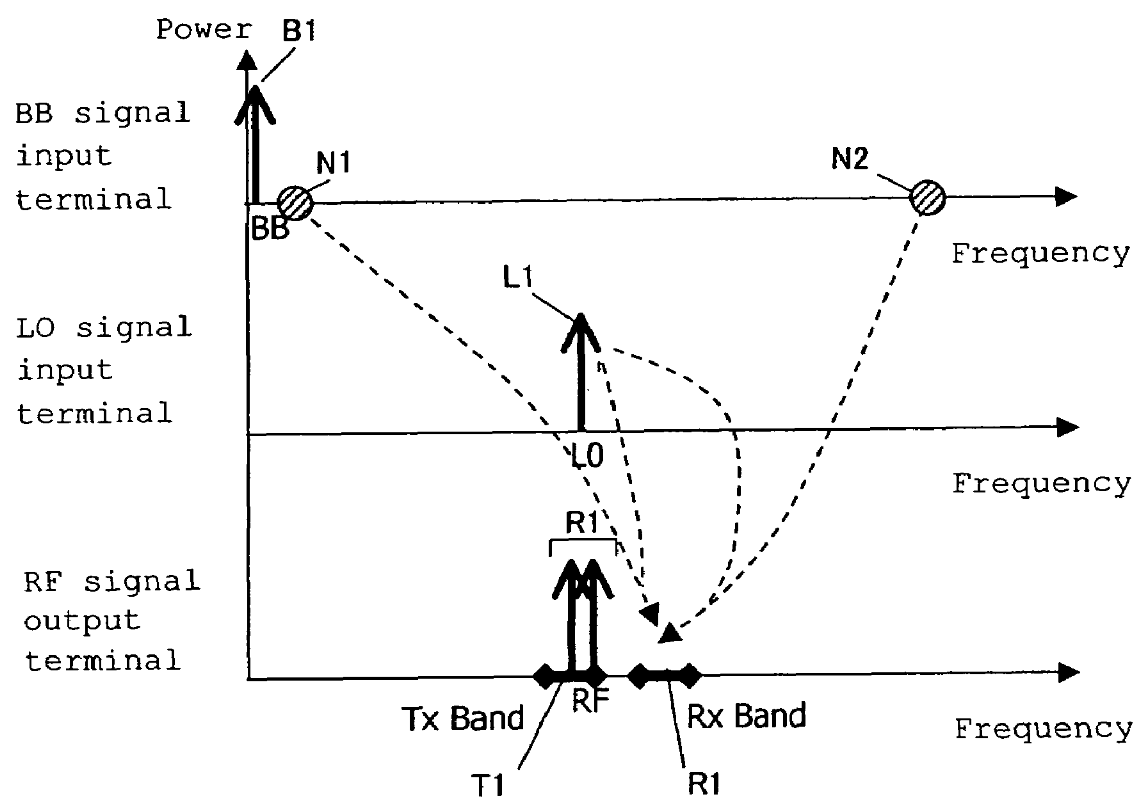
FIG. 9 is a view explaining noise converted to reception band frequency in frequency conversion circuit.
Figure 10:
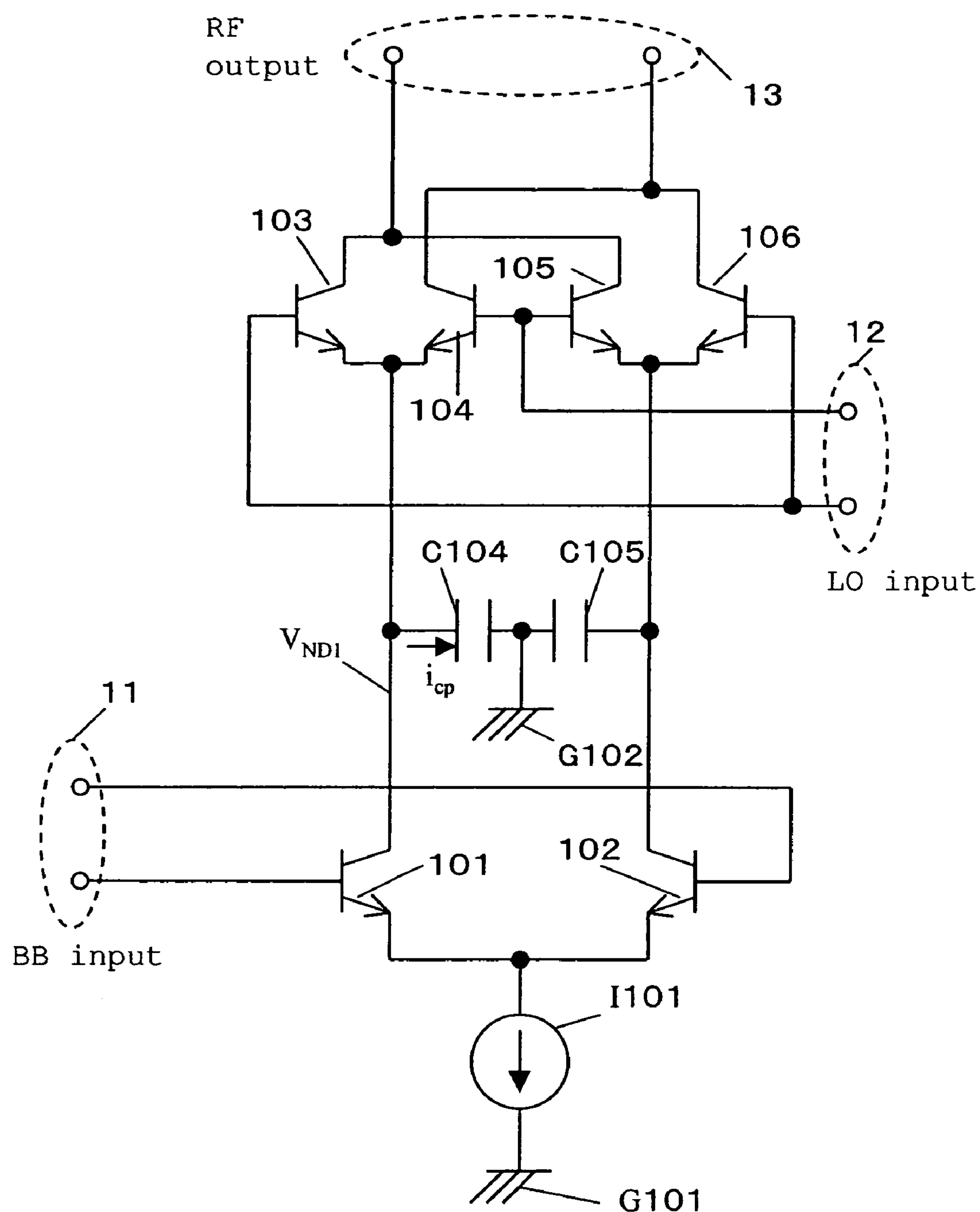
FIG. 10 is a view illustrating a conventional second frequency conversion circuit.
Figure 11:
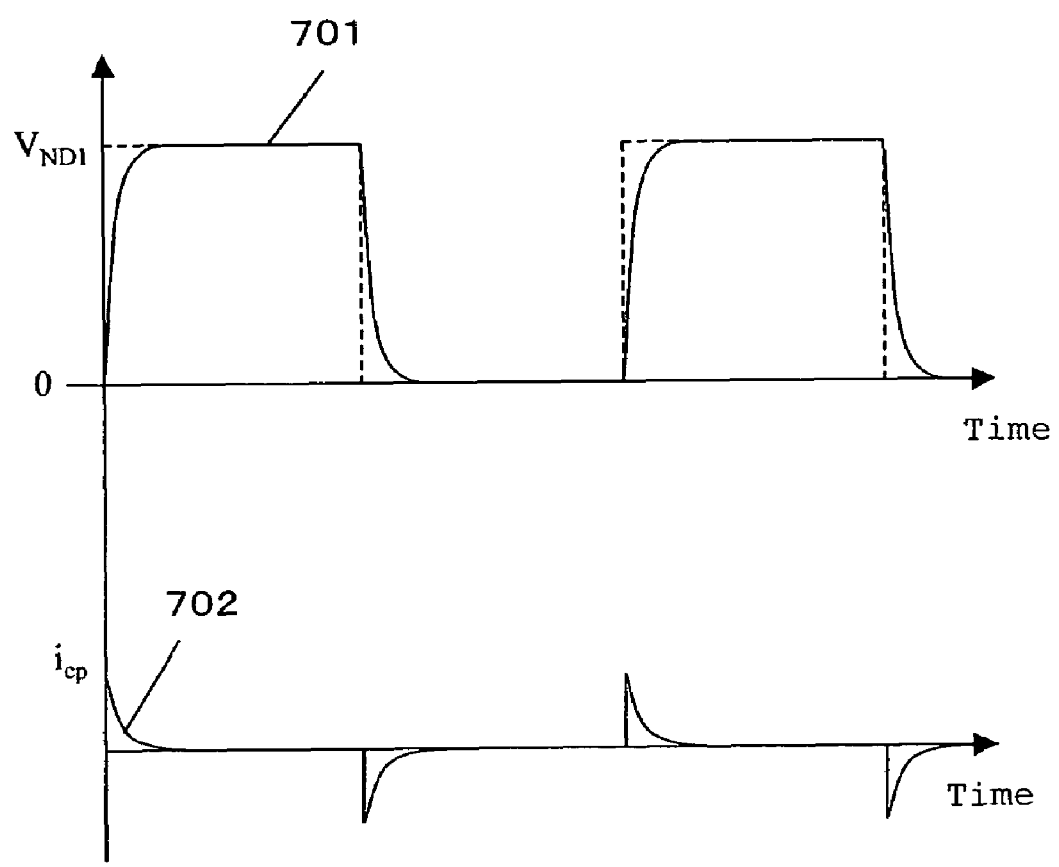
FIG. 11 is a view explaining delay of switching speed in a conventional second frequency conversion circuit.

FIG. 7 is a view illustrating a transmitting circuit of the fourth embodiment according to the present invention.

Portions with the same constitution as the frequency conversion circuit illustrated in FIG. 6 described in the third embodiment use the same symbols in FIG. 7.

The fourth embodiment has a configuration of a polar modulation circuit which performs amplitude modulation by performing phase modulation with the modulation circuit 500 of the second embodiment and bias-controlling the power amplifier 505.

The transmitting circuit of the fourth embodiment consists of the modulation circuit 500, the oscillator 504, the power amplifier 505, the sharing means 507 and the antenna 508 of the same configuration as the second embodiment illustrated in FIG. 5, an amplitude/phase information conversion section 511, a bias control section 512, an I input terminal 51, and a Q input terminal 52.

Next, referring to FIG. 7, the operation of a transmitting circuit of the fourth embodiment is described below.

Base bands I and Q signals are respectively inputted from the I input terminal 51 and the Q input terminal 52 to the amplitude/phase information conversion section 511 and divided to amplitude information and phase information. The divided phase information are mixed with a LO signal which is inputted into the modulation circuit 500 of the second embodiment and is inputted for phase modulation through the oscillator 504 and the 90° phase shifter 503 by the frequency conversion circuits 501, 502. An output of the modulation circuit 500 subjected to phase modulation is inputted into the power amplifier 505. Through the amplitude information divided from the amplitude/phase information conversion section 511, power voltage is controlled with a bias control section 512 for amplitude modulation. An output signal of the power amplifier 505 is radiated from the antenna 508 through the sharing means 507.

The transmitting circuit of the fourth embodiment can sufficiently dampen reception band noise with only the sharing means 507 because the reception band noise outputted from the modulation circuit 500 is in a low level. Thus, the transmission circuit can be realized without need for connecting an interstage (band pass) filter between the modulation circuit 500 and the power amplifier 505.

The present embodiment can also actualize a novel communication instrument capable of transmitting a signal of little reception zone noise by providing a communication instrument such as a mobile phone, PDA or a communication card with a transmitting circuit according to the present invention. Namely, such a communication instrument specifically includes the transmitting circuit of the fourth embodiment which outputs a transmitting signal and a reception circuit for inputting a reception signal, and the sharing means 507 is a communication instrument which guides a signal received by the antenna 508 to a reception circuit. Thus the sharing means 507 includes not only a function of guiding a transmitting signal outputted from the isolator 505 to the antenna 508, but also a function of guiding a signal received by the antenna 508 to the reception circuit.

As will be apparent from the foregoing description, according to the present invention, it is possible to provide a frequency conversion circuit, a modulation circuit, a transmitting circuit without an interstage filter, and a communication instrument, capable of achieving a low level of reception band frequency noise because a noise level converted to a reception band frequency from around a frequency twice as large as a local signal can be suppressed without any generation of flicker noise.

What is claimed is:

1. A frequency conversion circuit performing modulation by mixing an input signal with a local signal, the frequency conversion circuit comprises:

a first input terminal pair inputted with the input signal;

a second input terminal pair inputted with the local signal;

an output terminal pair outputted with an output signal;

a first transistor whose base is electrically connected with one of the first input terminal pair;

a second transistor whose base is electrically connected with the other of the first input terminal pair;

third and fourth transistors whose emitters are electrically connected respectively with a collector of the first transistor;

fifth and sixth transistors whose emitters are electrically connected respectively with a collector of the second transistor;

a differential noise suppression circuit which is provided between the collector of the first transistor and the collector of the second transistor, includes at least one capacitor, which suppresses a differential noise component of a frequency twice as large as a local signal frequency without repeating charging or discharging the capacitor with at least the local signal frequency, wherein one of the second input terminal pair is electrically connected with the base of the third and the sixth transistors, the other of the second input terminal pair is electrically connected with the base of the fourth and the fifth transistors, one of the output terminal pair is electrically connected with the collector of the third and the fifth transistors, and the other of the output terminal pair is electrically connected with the collector of the fourth and the sixth transistors.

2. The frequency conversion circuit according to claim 1, wherein the frequency conversion circuit comprises a common noise suppression circuit which is electrically connected with the output terminal pair and suppresses a common noise component of a frequency twice as large as the local signal.

3. The frequency conversion circuit according to claim 2, wherein the common noise suppression circuit is such a circuit that a common signal of the frequency twice as large as the local signal is shorted.

4. The frequency conversion circuit according to claim 1, wherein the differential noise suppression circuit has first and second capacitors electrically connected in parallel to each other, and a resultant capacitance of the first and the second capacitors has a self resonance frequency around the frequency twice as large as the local signal.

5. The frequency conversion circuit according to claim 4, wherein the first and the second capacitors are MIM or MOS capacitors formed on a semiconductor substrate, an upper electrode of the first capacitor is disposed so as to be electrically connected with a lower electrode of the second capacitor, and a lower electrode of the first capacitor is disposed so as to be electrically connected with an upper electrode of the second capacitor.

6. The frequency conversion circuit according to claim 1, wherein the differential noise suppression circuit includes a capacitor and an inductor electrically connected in series to each other, and is a resonator including a resonance frequency around the frequency twice as large as the local signal.

7. The frequency conversion circuit according to claim 1, wherein the differential noise suppression circuit includes first and second capacitors electrically connected in series to each other, and an impedance element, inhibiting a signal of the local frequency, of which one is electrically connected with a junction between the first capacitor and the second capacitor and of which the other is grounded.

8. The frequency conversion circuit according to claim 7, wherein the impedance element is an inductor.

9. The frequency conversion circuit according to claim 7, wherein the impedance element is a resistor.

10. The frequency conversion circuit according to claim 7, wherein the impedance element is a capacitor.

11. The frequency conversion circuit according to claim 1, wherein the common noise suppression circuit is balun.

12. The frequency conversion circuit according to claim 1, wherein the third and the sixth transistors are MOSFET of a triple-well structure consisting of a p-well, an n-well and a semiconductor substrate, the p-well being electrically connected with a ground terminal through a first resistor and the n-well being electrically connected with a power terminal through a second resistor.

13. A modulation circuit comprising:

a first frequency conversion circuit;

a second frequency conversion circuit; and a 90° phase shifter connected with the first and the second frequency conversion circuits respectively, wherein the first frequency conversion circuit uses the frequency conversion circuit according to claim 1, and the second frequency conversion circuit is the frequency conversion circuit according to claim 1.

14. A quadrature modulation transmitting circuit comprising: a modulation circuit;

an oscillator of inputting a local signal into a 90° phase shifter of the modulation circuit;

a power amplifier of amplifying a signal modulated by the modulation circuit;

an isolator inputted with a signal amplified by the power amplifier; and sharing means of guiding a signal from the isolator to an antenna, wherein the modulation circuit is the modulation circuit according to claim 13.

15. A communication instrument comprising:

a transmitting circuit of outputting a transmitting signal and a reception circuit of inputting a reception signal, wherein the sharing means guides a reception signal received by the antenna to the reception circuit and the transmitting circuit uses the transmitting circuit according to claim 14.

16. A polar modulation transmitting circuit comprising:

a phase modulation section;

an amplitude modulation section connected with the phase modulation section and sharing means of guiding an output signal from the amplitude modulation section to an antenna, wherein the phase modulation section uses the modulation circuit according to claim 13.

17. A communication instrument comprising:

a transmitting circuit of outputting a transmitting signal and a reception circuit of inputting a reception signal, wherein the sharing means guides the reception signal received by the antenna to the reception circuit and the transmitting circuit uses the transmitting circuit according to claim 16.

18. A frequency conversion method performing frequency conversion using a frequency conversion circuit performing modulation by mixing an input signal with a local signal, wherein the frequency conversion circuit comprises:

a first input terminal pair inputted with the input signal;

a second input terminal pair inputted with the local signal;

an output terminal pair outputted with an output signal;

a first transistor whose base is electrically connected with one of the first input terminal pair;

a second transistor whose base is electrically connected with the other of the first input terminal pair;

third and fourth transistors whose emitters are electrically connected respectively with a collector of the first transistor;

fifth and sixth transistors whose emitters are electrically connected respectively with a collector of the second transistor;

wherein one of the second input terminal pair is electrically connected with the base of the third and the sixth transistors, the other of the second input terminal pair is electrically connected with the base of the fourth and the fifth transistors, one of the output terminal pair is electrically connected with the collector of the third and the fifth transistors, and the other of the output terminal pair is electrically connected with the collector of the fourth and the sixth transistors, the frequency conversion method comprising differential noise component suppressing step including at least one capacitor which, between the collector of the first transistor and the collector of the second transistor, suppresses a differential noise component of a frequency twice as large as a local signal frequency without repeating charging or discharging the capacitor with at least the local signal frequency.

* * * * *